(12) United States Patent
Shenoy

(10) Patent No.: US 10,833,671 B2
(45) Date of Patent: Nov. 10, 2020

(54) INCREASING FORWARD BIASED SAFE OPERATING AREA BY SOURCE SEGMENTATION

(71) Applicant: Infineon Technologies Americas Corp., El Segundo, CA (US)

(72) Inventor: Praveen Shenoy, Chandler, AZ (US)

(73) Assignee: INFNIEON TECHNOLOGIES AMERICAS CORP., El Segundo, CA (US)

(*) Notice: Subject to any disclaimer, the term of this patent is extended or adjusted under 35 U.S.C. 154(b) by 0 days.

(21) Appl. No.: 16/167,915

(22) Filed: Oct. 23, 2018

(65) Prior Publication Data

US 2020/0127656 A1    Apr. 23, 2020

(51) Int. Cl.
*H03K 17/082* (2006.01)
*H01L 29/10* (2006.01)
*H01L 29/739* (2006.01)

(52) U.S. Cl.
CPC ..... *H03K 17/0822* (2013.01); *H01L 29/1095* (2013.01); *H01L 29/7397* (2013.01)

(58) Field of Classification Search
CPC ............ H03K 17/0822; H01L 29/1095; H01L 29/7397

See application file for complete search history.

(56) References Cited

U.S. PATENT DOCUMENTS

| | | | |
|---|---|---|---|
| 2005/0173757 A1* | 8/2005 | Peake | H01L 29/7808 257/329 |
| 2006/0124996 A1* | 6/2006 | Mizokuchi | H01L 29/7813 257/330 |
| 2007/0205442 A1 | 9/2007 | Torii | |
| 2016/0163854 A1 | 6/2016 | Nishimura | |

FOREIGN PATENT DOCUMENTS

| EP | 0405138 A2 | 1/1991 |
|---|---|---|
| EP | 0772241 A1 | 5/1997 |

OTHER PUBLICATIONS

Hu, Chenming, et al., "Optimum Design of Power MOSFETs," IEEE Transactions on Electron Devices, vol. ED-31, No. 12, Dec. 1984, pp. 1693-1700.

* cited by examiner

*Primary Examiner* — Syed I Gheyas
(74) *Attorney, Agent, or Firm* — Slater Matsil, LLP

(57) ABSTRACT

A power device includes two gate stripes formed on an upper surface of the device, a source stripe perimeter comprising the total available shared perimeter between the two gate stripes and a corresponding source stripe, and a segmented source formed between the two gate stripes, wherein an edge length of the segmented source covers between 5% to 95% of the source stripe perimeter.

20 Claims, 16 Drawing Sheets

1600

| PARAMETER | | W(norm) | Tm divg(C) | RonA(norm) |
|---|---|---|---|---|
| | | | | |
| SOURCE SEGMENTATION | DUAL SIDE | 1 | 19.1 | 1.09 |
| | 50% SOURCE | 0.5 | 10.7 | 1.21 |
| | | | | |
| CELL PITCH | 1, 50% SOURCE | 0.5 | 10.7 | 1.21 |
| | 2, DUAL SIDE | 0.5 | 10.6 | 2.09 |

| TECH | SOURCE% | Rdson | PW = 10ms |
|---|---|---|---|
| | | | AVG ID |
| | | mΩ | A |
| R9SJ 60VP, 450um | 33.3 | 33.4 | 9.5 |
| | 50.0 | 30.0 | 8.7 |
| | 66.7 | 28.5 | 7.5 |
| | 100.0 | 27.0 | 6.3 |
| 100-66.7% CHANGE | | 5.4% | 17.4% |
| 100-50% CHANGE | | 10.5% | 32.0% |
| 100-33.3% CHANGE | | 21.2% | 40.5% |

FIG. 17

| WELL AND CELL GEOMETRIES | LINEAR CELL 2202 | SQUARE WELL IN SQUARE CELL 2204 | CIRCLE IN SQUARE CELL 2206 | HEXAGON IN SQUARE CELL 2208 | SQUARE IN HEXAGONAL CELL 2210 | CIRCLE IN HEXAGONAL CELL 2212 | HEXAGON IN HEXAGONAL CELL 2214 |
|---|---|---|---|---|---|---|---|
| UNIT CELL | s+a, s | s+a, s | s | s | s+a, s | s | s |

FIG. 22

INCREASING FORWARD BIASED SAFE OPERATING AREA BY SOURCE SEGMENTATION

TECHNICAL FIELD

The present invention relates generally to a device and method for increasing Forward Biased Safe Operating Area ("FBSOA").

BACKGROUND

FIG. 1 shows FBSOA 100 as the area under various limitation curves. For example, FBSOA is limited by a maximum current limitation 102. FBSOA is also limited by maximum power limitations. Power limitation curves are shown for 100 μs (104), 1 ms (106), 10 ms (108), and DC (110). A thermal instability limitation curve 112 and a $R_{DS(on)}$ limitation curve 116 are also shown in FIG. 1.

Generally, FBSOA is an important consideration in linear mode applications and in the design and use of pass-through Field-Effect Transistors ("FETs"). N-channel Metal-Oxide-Semiconductor FETs ("MOSFETs") are usually used in switching applications and hence FBSOA is sacrificed for $R_{DS(on)}$ and other parameters. P-channel MOSFETs are usually used in linear mode applications and hence FBSOA is also an important parameter for these devices as well.

It is difficult to improve FBSOA significantly.

FBSOA is determined by a complex chain of events involving electrical and thermal imbalances, amplified by a positive feedback at current levels below the zero-temperature coefficient point. A biasing point exists where the drain current and the transconductance of a device are temperature independent. Such a point is known as the zero-temperature coefficient (ZTC) bias point.

An imbalance in electrical characteristics, particularly in the device channel (Vt, Gm) will cause higher current density in one location. This leads to higher local power dissipation, resulting in a higher temperature, which then causes lower Vt, thus leading to even higher currents and the cycle continues eventually causing thermal runaway.

Even in the absence of electrical imbalances, an inherent thermal impedance imbalance between a die center and die edge causes the center of die to be hotter which then leads to electrical imbalance in Vt leading to eventual thermal run away.

This thermal imbalance is more pronounced in large versus small die leading to failures in die center at currents not proportional to die area.

Referring again to FIG. 1, the thermal instability region reduces FBSOA at high voltages as is seen in limitation curve 112. Reducing the thermal instability would result in an improved maximum power slope as shown by dashed line 114. It is clear that reducing thermal instability significantly increases FBSOA at higher voltages.

SUMMARY

A power device comprises at least two gate stripes formed on an upper surface of the device; a source stripe perimeter comprising the total available shared perimeter between the at least two of gate stripes and a corresponding source stripe; and a segmented source formed between the at least two gate stripes, wherein an edge length of the segmented source covers between 5% to 95% of the source stripe perimeter.

BRIEF DESCRIPTION OF THE DRAWINGS

For a more complete understanding of the present invention, and the advantages thereof, reference is now made to the following descriptions taken in conjunction with the accompanying drawings, in which:

FIG. 16 is a table of simulation results for assessing the performance of segmented source devices according to embodiments;

FIG. 17 is a table of experimental results for assessing the performance of segmented source devices according to embodiments;

FIG. 22 illustrates plan views of various power device cell configurations suitable for comprising segmented sources according to embodiments.

DETAILED DESCRIPTION OF ILLUSTRATIVE EMBODIMENTS

Figure 2:
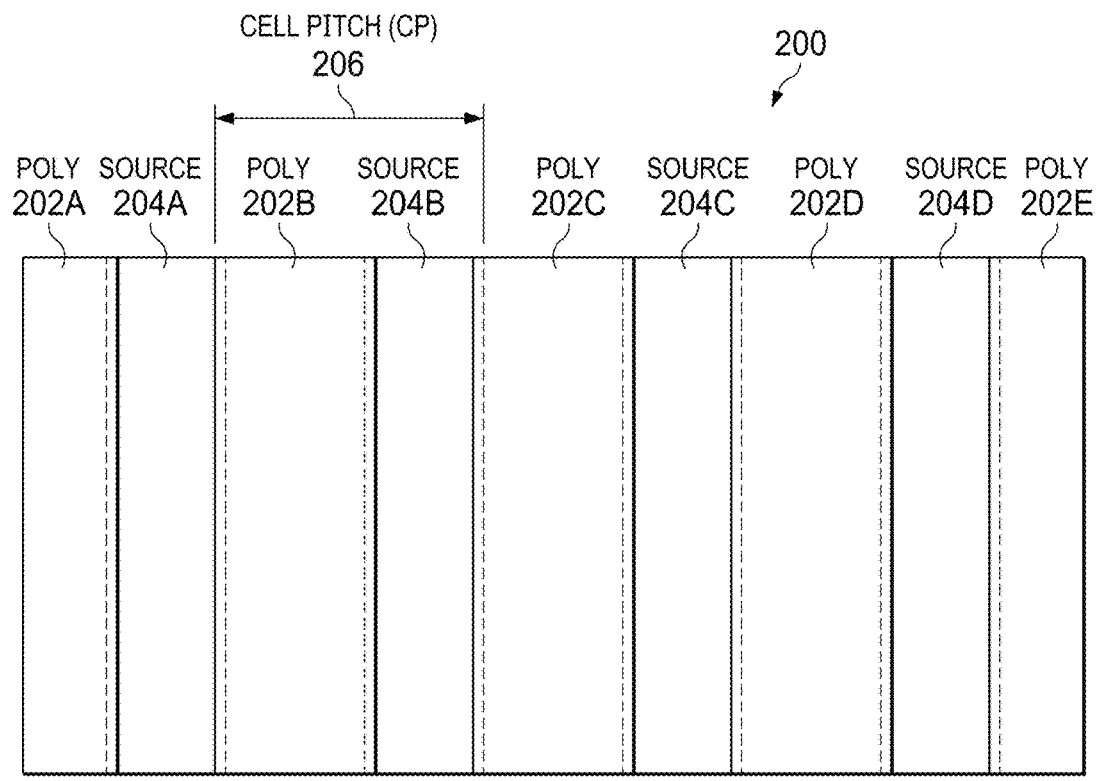
FIG. 2 is a plan view of a typical power device comprising a plurality of gate stripes and a plurality of source stripes.

FIG. 2 is a plan view of a typical power device comprising a plurality of polysilicon gate stripes 202A, 202B, 202C, 202D, and 202E, and a plurality of source stripes 204A, 204B, 204C, and 204D. While five polysilicon gate stripes and four source stripes are shown in FIG. 2, any number can be used in a typical power device. The cell pitch ("cp") 206 of the power device is shown in FIG. 2, corresponding generally to the distance between a first polysilicon gate stripe such as gate stripe 202B, and a second polysilicon gate stripe such as gate stripe 202C.

Figure 1:
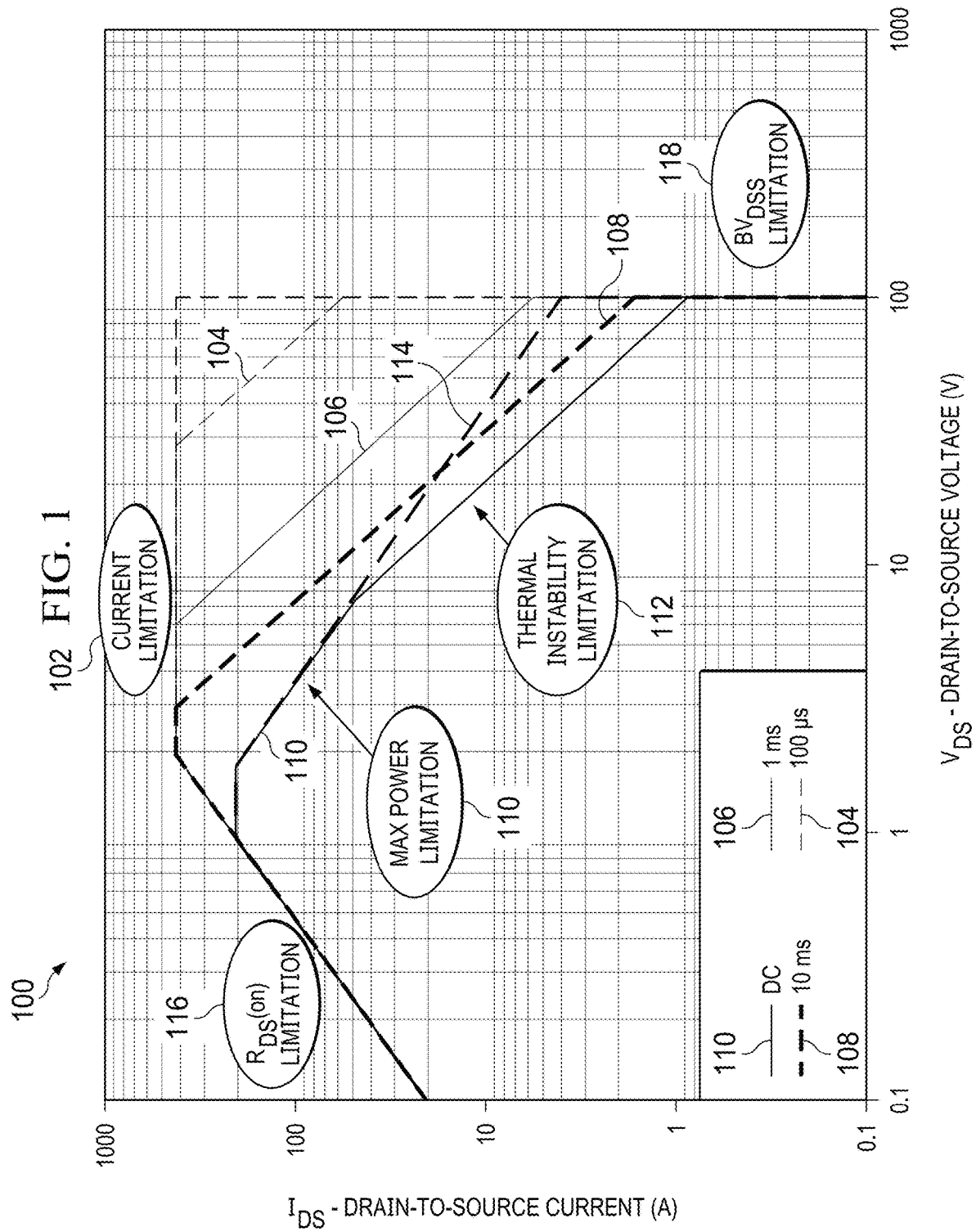
FIG. 1 is a chart of FBSOA for a typical power device.
Figure 3:
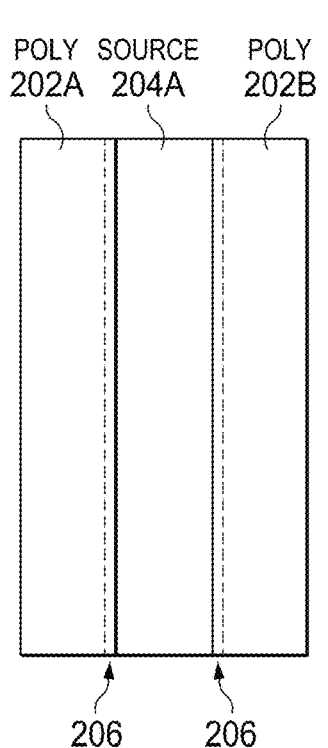
FIG. 3 is a plan view of a typical power device comprising two gate stripes and a single source stripe.

FIG. 3 is a plan view of a typical power device comprising two gate stripes 202A and 202B, and a single source stripe 204A. The total shared perimeter between the polysilicon gate stripes 202A and 202B and the source stripe 204A is defined as a "source stripe perimeter" to help explain the source segmentation of embodiments described herein. For example, in FIG. 3, the edges 206 of the source stripe 204A "covers" or occupies 100% of the "source stripe perimeter" of the device. The typical power device shown in FIG. 3 may suffer thermal instability limitations at higher voltages along curve 112 as was explained with respect to FIG. 1. Devices using source segmentation according to embodiments cover less than 100% of the source stripe perimeter in order to improve thermal stability at higher operating voltages in order to maximize FBSOA and extending thermal instability limitation curve from 112 to 114 as was shown in FIG. 1. In the conventional device of FIG. 3, the source 204A can occupy some or all of the area between the polysilicon gate stripes 202A and 202B, but occupies 100% of the source stripe perimeter as defined above.

Figure 4:
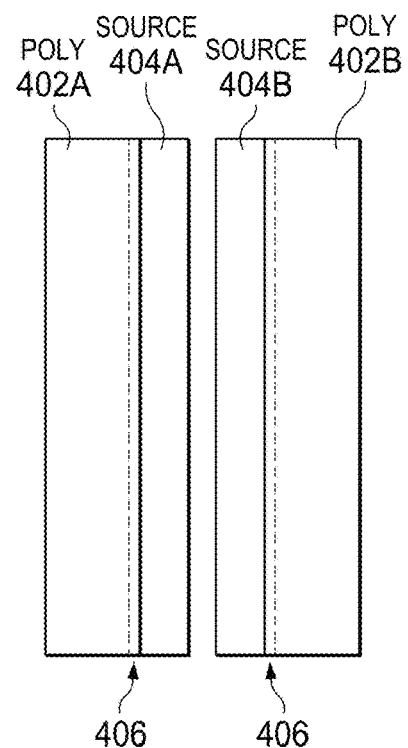
FIG. 4 is a plan view of a typical power device comprising two gate stripes and two source stripes.

FIG. 4 is a plan view of a typical power device comprising two source stripes 404A and 404B, and two polysilicon gates 402A and 402B. In FIG. 4, the edges 406 of the source stripes 404A and 404B "covers" or occupies 100% of the "source stripe perimeter" of the device. Thus, the device shown in FIG. 4 is not considered to have source segmentation according to embodiments. While the total source area of the device in FIG. 4 is less than that of the device shown in FIG. 3, both devices still cover 100% of the source stripe perimeter of the device.

Figure 5:
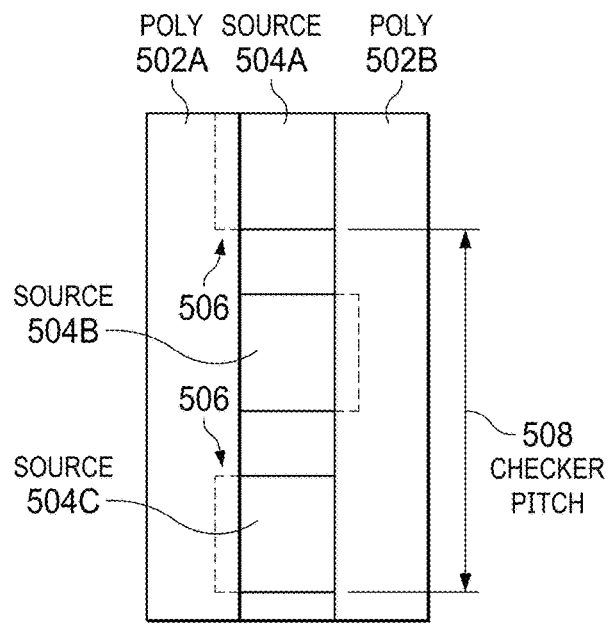
FIG. 5 is a plan view of a power device according to an embodiment comprising a checkered source.

FIG. 5 is a plan view of a power device according to an embodiment comprising a checkered source including individual sources 504A, 504B, and 504C, and polysilicon gate stripes 502A and 502B. Note that source 504A is laterally spaced apart from polysilicon gate stripe 502B and source 504B. Source 504B is laterally spaced apart from polysilicon gate stripe 502A and sources 504A and 504C. Source 504C is laterally spaced apart from polysilicon gate stripe 502B and source 504B. In FIG. 5, the total edge length 506 of the sources 504A, 504B, and 504C covers less than 50% of the "source stripe perimeter" 506 of the device. Optimum source segmentation coverage percentages for improving thermal stability at higher operating voltages in order to maximize FBSOA are discussed in detail below. The checker pattern pitch 508 is shown in FIG. 5. The checker pitch is defined as a distance including the length of sources 504B and 504C, the distance between the sources, and half of the distance between the next source above (source 504A) and the next source below.

Figure 6A:
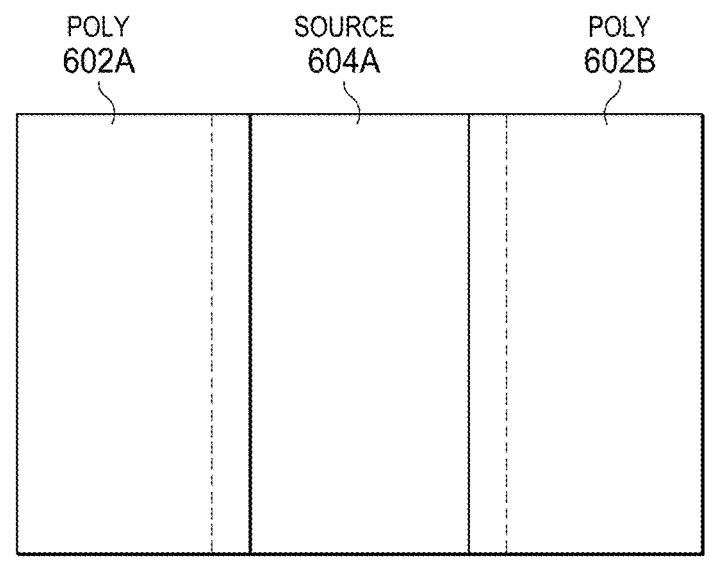
FIG. 6A is a plan view of a typical power device comprising two gate stripes and single source stripe.
Figure 6B:
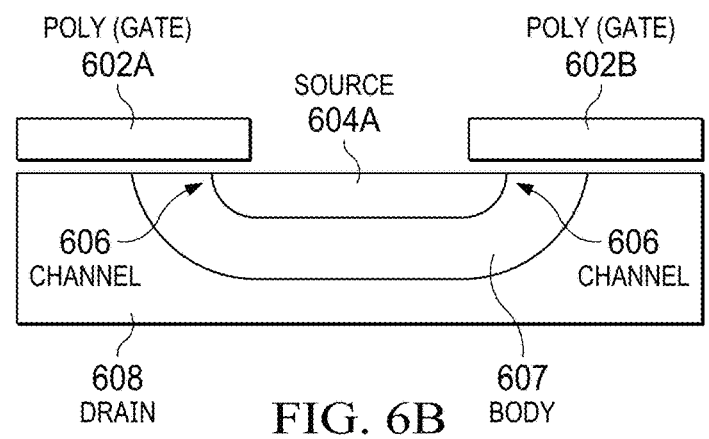
FIG. 6B is a cross-sectional view of the typical power device corresponding to the plan view of FIG. 6A.

FIG. 6A is a plan view of a typical power device comprising two polysilicon gate stripes 602A and 602B and single source stripe 604A. FIG. 6B is a cross-sectional view of the typical power device corresponding to the plan view of FIG. 6A showing the polysilicon gate stripes 602A and 602B formed on an upper surface of the device. The source 604A extends generally from polysilicon gate 602A to polysilicon gate 602B. The cross-sectional view of FIG. 6B also shows a body region 607, channel regions 606, and a drain 608 extending to a bottom surface of the device.

Figure 7A:
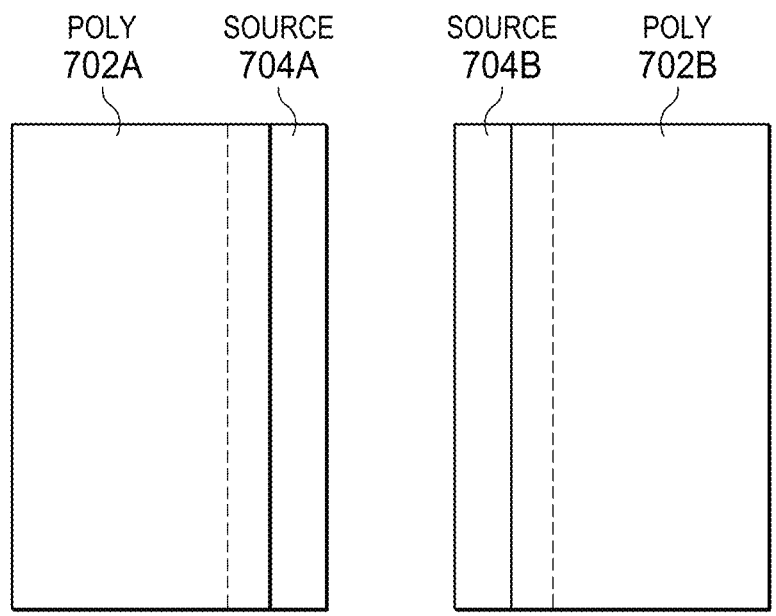
FIG. 7A is a plan view of a typical power device comprising two gate stripes and two source stripes.
Figure 7B:
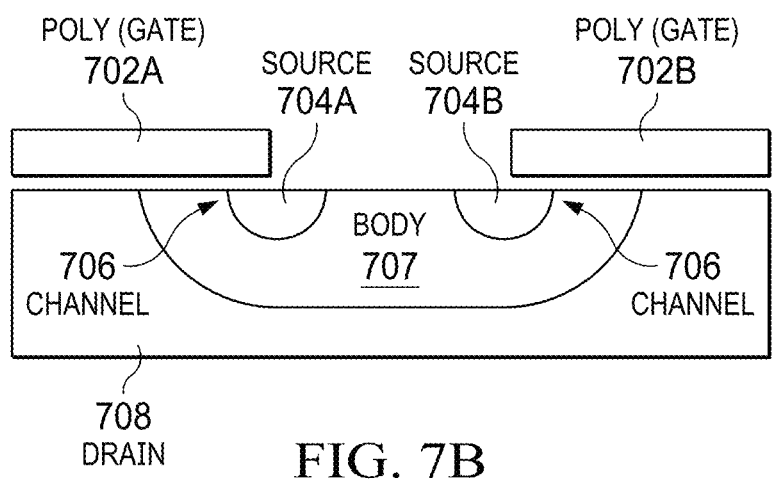
FIG. 7B is a cross-sectional view of the typical power device corresponding to the plan view of FIG. 7A.

FIG. 7A is a plan view of a typical power device comprising two polysilicon gate stripes 702A and 702B and two source stripes 704A and 704B. FIG. 7B is a cross-sectional view of the typical power device corresponding to the plan view of FIG. 7A showing the polysilicon gates 702A and 702B formed on an upper surface of the device. While polysilicon gates are shown, other materials can be used. The source 704A extends generally from polysilicon gate 702A to a distance approximately one third of the way to polysilicon gate 702B. Similarly, source 704B extends generally from polysilicon gate 702B to a distance approximately one third of the way to polysilicon gate 702A. The cross-sectional view of FIG. 7B also shows a body region 707, channel regions 706, and a drain 708 extending to a bottom surface of the device. Note that the edge of sources 704A and 704B is not segmented because they occupy 100% of the total source stripe perimeter as defined above. The sources 704A, 704B, and the channel region 706 are shown as doped regions within the drain region 708. Other techniques for forming the sources, body, channel, and drain can be used, while preserving the general cross-sectional configuration shown in FIG. 7B.

Figure 8A:
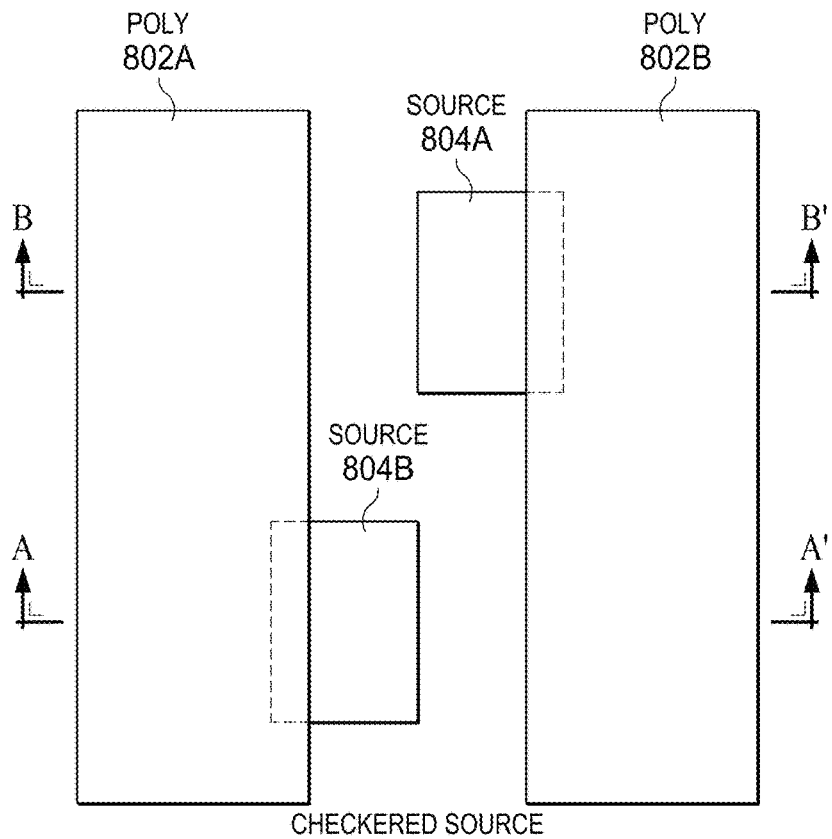
FIG. 8A is a plan view of a power device comprising a checkered source according to an embodiment.

FIG. 8A is a plan view of a power device comprising polysilicon gate stripes 802A and 802B, as well as a checkered source including sources 804A and 804B according to an embodiment. FIG. 8A also includes lines AA' and BB' defining planes orthogonal to the surface of the device for creating the cross-sectional views shown in FIGS. 8B and 8C, respectively. In FIG. 8A note that the edge length of sources 804A and 804B cover less than 50% of the available source stripe perimeter as was defined above.

Figure 8B:
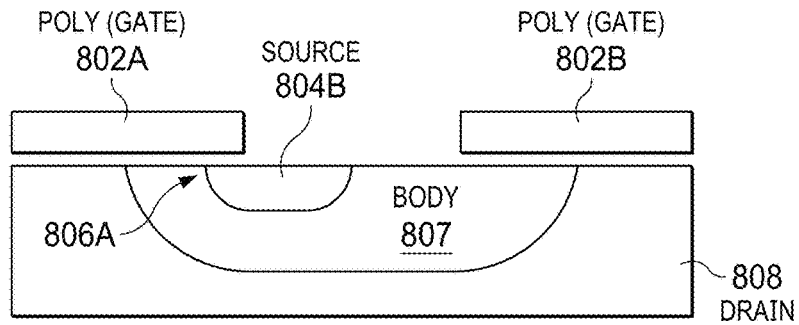
FIG. 8B is a first cross-sectional view of the power device comprising a checkered source corresponding to the plan view of FIG. 8A.

FIG. 8B is a first cross-sectional view of the power device along the plane defined by line AA' comprising a checkered source 804A, 804B corresponding to the plan view of FIG. 8A. Note that the source 804B extends generally from polysilicon gate 802A to a distance approximately halfway to polysilicon gate 802B. A channel 806A, a body region 807, and a drain extending to a bottom surface of the power device is also shown in FIG. 8B.

Figure 8C:
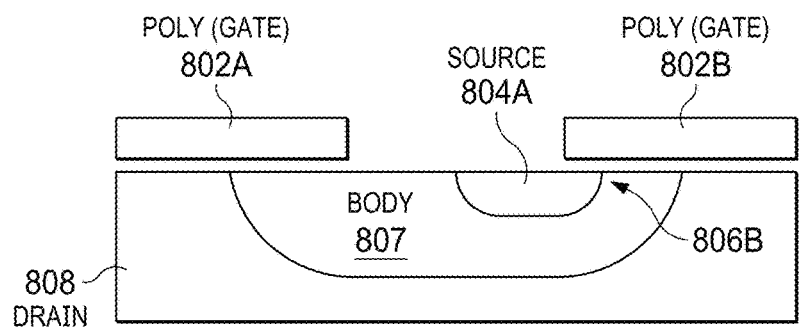
FIG. 8C is a second cross-sectional view of the power device comprising a checkered source corresponding to the plan view of FIG. 8A.

FIG. 8C is a second cross-sectional view of the power device along the plane defined by line BB' comprising a checkered source 804A, 804B corresponding to the plan view of FIG. 8A. Note that the source 804A extends generally from polysilicon gate 802B to a distance approximately halfway to polysilicon gate 802A. A channel 806B, a body region 807, and a drain extending to a bottom surface of the power device is also shown in FIG. 8C. Other techniques for forming the source, body, channel, and drain can be used, while preserving the general cross-sectional configuration shown in FIG. 8B or 8C.

Figure 9:
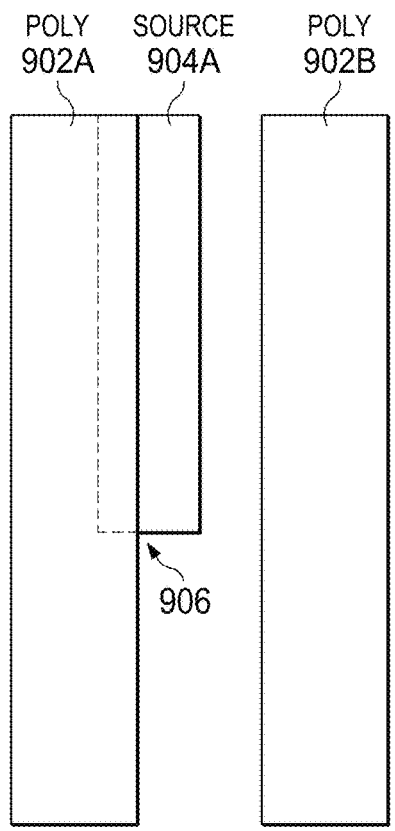
FIG. 9 is a plan view of a power device comprising a partial single side source according to an embodiment.

FIG. 9 is a plan view of a power device comprising polysilicon gate stripes 902A and 902B and a partial single side source 904A according to an embodiment. In FIG. 9, the edge 906 of the partial single side source 904A covers less than 50% of the "source stripe perimeter" of the device as defined above. In the embodiment of FIG. 9, partial single side source 904A covers approximately 25% of the total available source stripe perimeter. While only two polysilicon gate stripes, one source 904A, and one source stripe edge 906 is shown in FIG. 9, it will be appreciated by those in the art that the plan view pattern shown is repeated both in the "X" and "Y" directions as many times as is desired. As previously mentioned, optimum source segmentation coverage percentages for improving thermal stability at higher operating voltages in order to maximize FBSOA are discussed in detail below.

Figure 10:
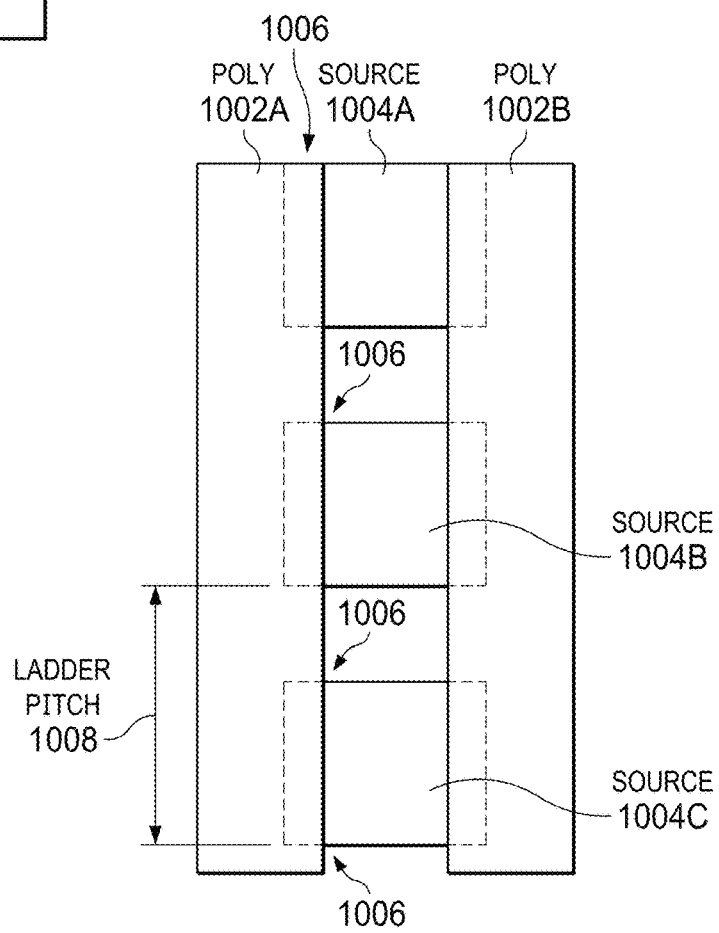
FIG. 10 is a plan view of a power device comprising a laddered source according to an embodiment.

FIG. 10 is a plan view of a power device comprising a laddered source according to an embodiment. In FIG. 10, the total length of the edges 1006 of the laddered sources 1004A, 1004B, and 1004C covers more than 50% of the total available source stripe perimeter of the device as was previously defined. In the embodiment of FIG. 10, the total edge length 1006 of the laddered sources 1004A, 1004B, and 1004C covers approximately 67% of the source stripe perimeter. While only two polysilicon gate stripes, three sources 1004A, 1004B, and 1004C, and one source stripe edge 1006 is shown in FIG. 10, it will be appreciated by those in the art that the plan view pattern shown is repeated both in the "X" and "Y" directions as many times as is desired. As previously mentioned, optimum source segmentation coverage percentages for improving thermal stability at higher operating voltages in order to maximize FBSOA are discussed in detail below. The ladder pitch 1008 is shown in FIG. 10, and can be defined as a distance including the length of a source and the distance to another source. For example, source 1004C and the distance to source 1004B can be used to define the ladder pitch 1008.

While checkered source, partial single side source, and laddered source segmented patterns have been shown, other geometrical patterns that reduce the percentage of source coverage of the source stripe perimeter (segmented sources), preferably symmetrically, can be used. Some examples of segmented sources were shown and described above, but are not intended to be limiting. Other such segmented source patterns can be made for improving thermal stability at higher operating voltages.

The pattern pitch (for example the ladder or checker pitch) is ideally kept small so that temperature is uniform across the device. A range of few microns to tens of microns can be used in an embodiment.

Figure 11A:
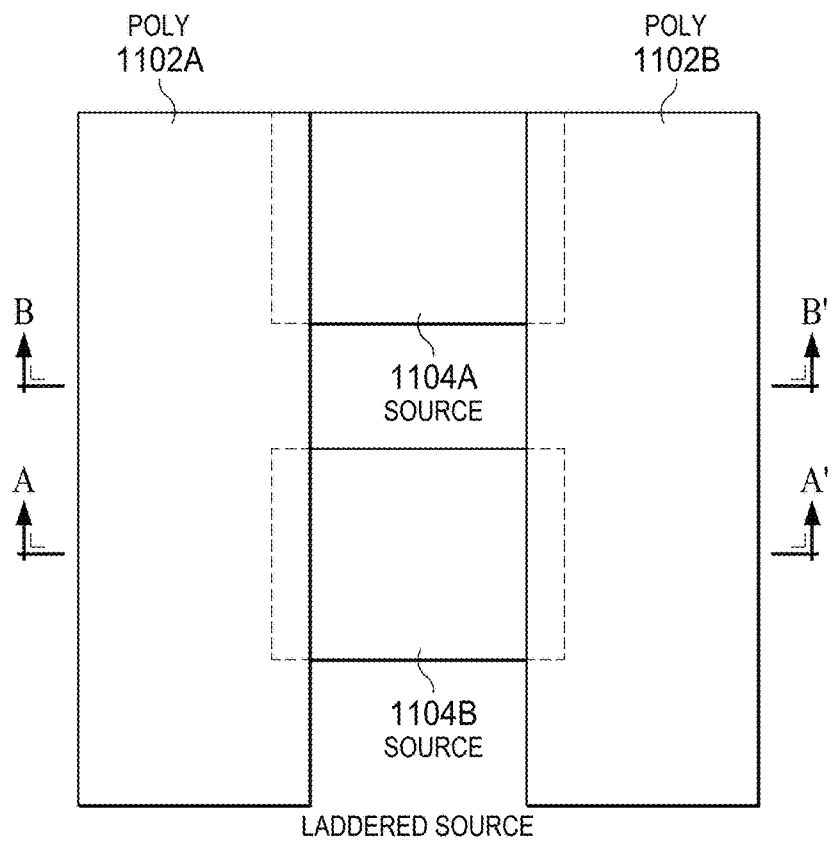
FIG. 11A is a plan view of a power device comprising a laddered source according to an embodiment.

FIG. 11A is a plan view of a power device comprising polysilicon gate stripes 1102A and 1102B, as well as a laddered source including sources 1104A and 1104B according to an embodiment. FIG. 11A also includes lines AA' and BB' defining planes orthogonal to the surface of the device for creating the cross-sectional views shown in FIGS. 11B and 11C, respectively. The total edge length of sources 1104A and 1104B cover less than 100% of the total available source stripe perimeter.

Figure 11B:
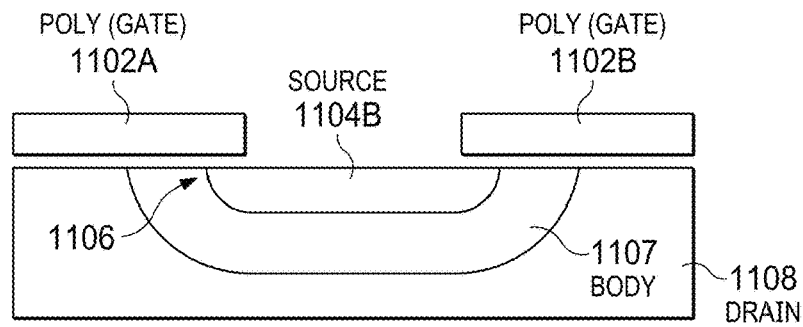
FIG. 11B is a first cross-sectional view of the power device comprising a laddered source corresponding to the plan view of FIG. 11A.

FIG. 11B is a first cross-sectional view of the power device along the plane defined by line AA' comprising a laddered source 1104A, 1104B corresponding to the plan view of FIG. 11A. Note that the source 1104B extends generally from polysilicon gate 1102A to polysilicon gate 1102B. Source 1104B, channel 1106, body 1107, and drain 1108 are shown in the cross-sectional view of FIG. 11B.

Figure 11C:
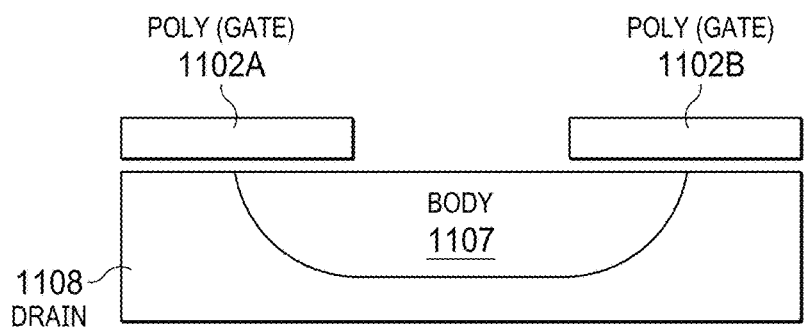
FIG. 11C is a second cross-sectional view of the power device comprising a laddered source corresponding to the plan view of FIG. 11A.

FIG. 11C is a second cross-sectional view of the power device along the plane defined by line BB' comprising a laddered source 1104A, 1104B corresponding to the plan view of FIG. 11A. Note that neither of the laddered sources 1104A or 1104B is shown in FIG. 11C. Only polysilicon gates 1102A and 1102B, body 1107, and drain 1108 are shown in the cross-sectional view of FIG. 11C.

Figure 12:
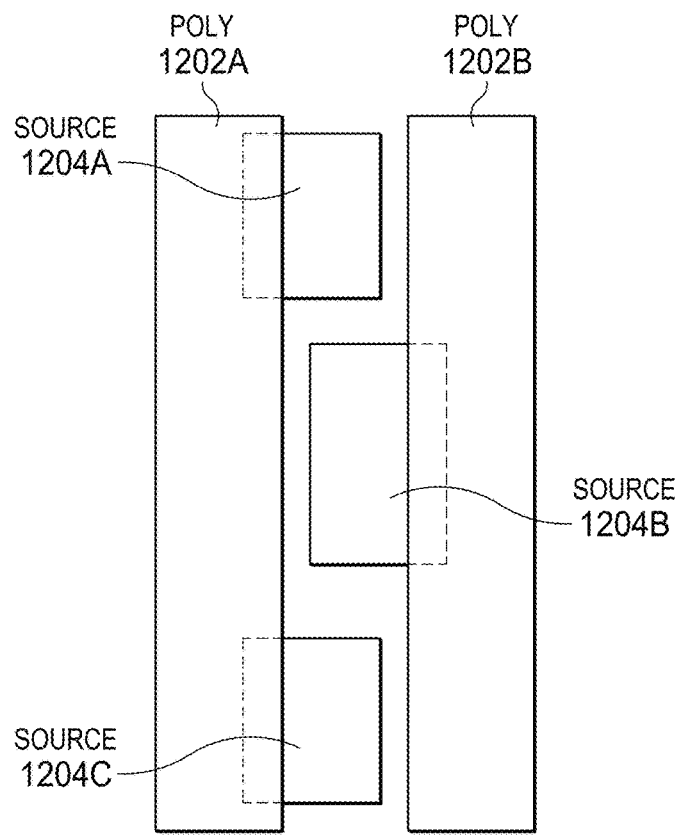
FIG. 12 is a plan view of a power device comprising an asymmetrical checkered source according to an embodiment.
Figure 13:
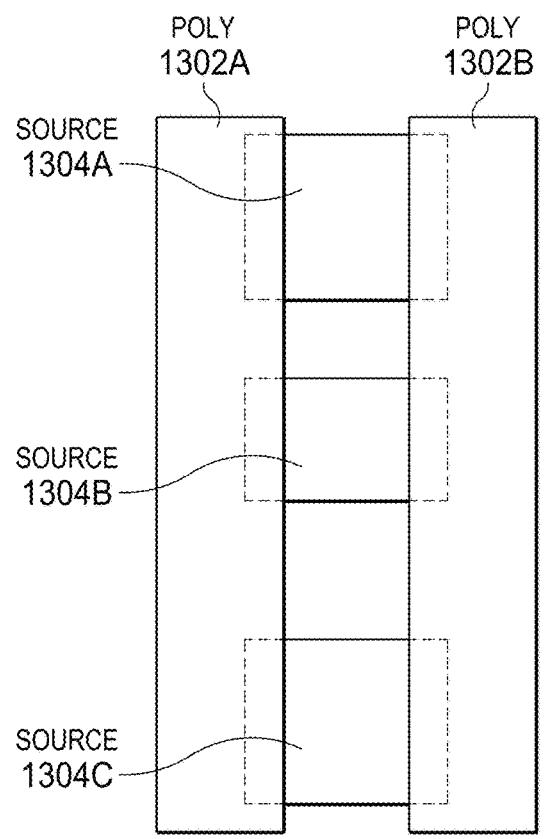
FIG. 13 is a plan view of a power device comprising an asymmetrical laddered source according to an embodiment.

FIGS. 12 and 13 show plan views of asymmetrical segmented source patterns. Previous segmented source patterns shown and described were symmetrical. Though symmetrical patterns are generally preferred as having superior thermal stability and relative absence of "hot spots" asymmetrical can also be used in specific applications if desired.

FIG. 12 is a plan view of a power device comprising an asymmetrical checkered source according to an embodiment, including polysilicon gate stripes 1202A and 1202B, as well as individual sources 1204A, 1204B, and 1204C. The spacing between sources 1204A and 1204B in the "Y" direction is smaller than the spacing between sources 1204B and 1204C in the "Y" direction. The plan view pattern shown in FIG. 12 is repeated in the "X" and "Y" directions as many times as is desired for a power device application.

FIG. 13 is a plan view of a power device comprising an asymmetrical laddered source according to an embodiment, including polysilicon gate stripes 1302A and 1302B, as well as individual sources 1304A, 1304B, and 1304C. The spacing between sources 1204A and 1204B in the "Y" direction is smaller than the spacing between sources 1204B and 1204C in the "Y" direction. The plan view pattern shown in FIG. 12 is repeated in the "X" and "Y" directions as many times as is desired for a power device application.

While corner rounding of the segmented sources occurs during photolithography processing and diffusion, corner rounding can be accentuated by design. Rounded corners offer a slightly better tradeoff between FBSOA and $R_{DS(on)}$.

Figure 14:
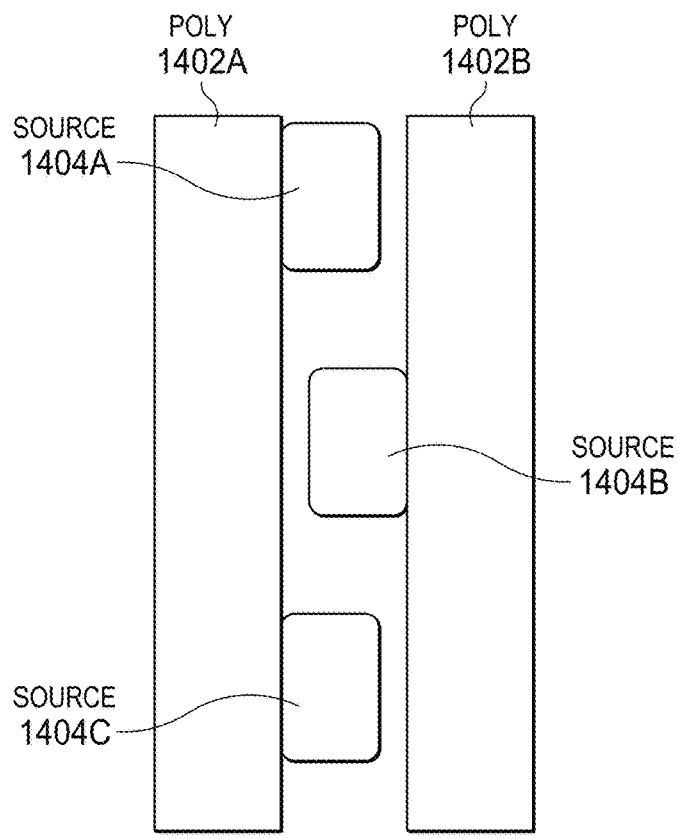
FIG. 14 is a plan view of a power device comprising a checkered source having rounded corners according to an embodiment.

FIG. 14 is a plan view of a power device comprising a checkered source having rounded corners according to an embodiment. The power device includes two polysilicon gate stripes 1402A and 1402B, individual rounded sources 1404A, 1404B, and 1404C. The rounded sources are shown as rectangular structures having rounded corners, but the amount of rounding can be further accentuated beyond that which is shown in FIG. 14 if desired. The plan view pattern shown in FIG. 14 is repeated in the "X" and "Y" directions as many times as is desired for a power device application.

Figure 15:
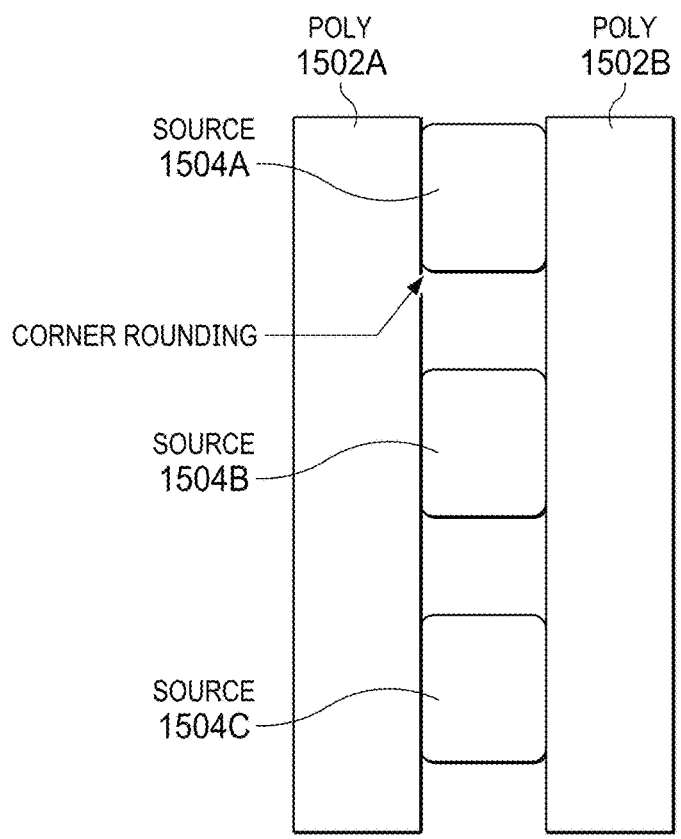
FIG. 15 is a plan view of a power device comprising a laddered source having rounded corners according to an embodiment.

FIG. 15 is a plan view of a power device comprising a laddered source having rounded corners according to an embodiment. The power device includes two polysilicon gate stripes 1502A and 1502B, individual rounded sources 1504A, 1504B, and 1504C. The rounded sources are shown as rectangular structures having rounded corners, but the amount of rounding can be further accentuated beyond that which is shown in FIG. 15 if desired. The plan view pattern shown in FIG. 15 is repeated in the "X" and "Y" directions as many times as is desired for a power device application.

FIG. 16 is a table of simulation results for assessing the performance of segmented source devices according to embodiments. Source segmentation is compared for a conventional (100% source) device and for a segmented source (with 50% source) device. Cell pitch is also compared for a 50% segmented source device and a conventional device. Parameters simulated include width (W), temperature divergence (Tm divg), and on resistance (RonA). Lower W (corresponding to a lower Gm) has lower Tm divergence and hence will have better FBSOA. 50% source segmentation and double cell pitch both give similar Tm divergence. However $R_{DS(on)}$ is significantly lower for the source segmentation design, and therefore superior in performance to the conventional device.

FIG. 17 is a table of experimental results for assessing the performance of segmented source devices according to embodiments. A power device was measured with 33.3%, 50%, 66.7%, and 100% segmented source coverage of the source stripe perimeter. Corresponding drain-to-source on resistance $R_{DS(on)}$ was measured as 33.4 mΩ, 30.0 mΩ, 28.5 mΩ, and 27.0 mΩ, with changes therebetween of 5.4%, 10.5%, and 21.2%. Corresponding power for 10 ms was measured with a drain current at 9.5 A, 8.7 A, 7.5 A, and 6.3 A, with changes therebetween of 17.4%, 32.0%, and 40.5%. Lower source segmentation percentage (corresponding to a lower Gm) has higher FBSOA drain current at all pulse widths. The FBSOA improvement starts to taper off at source segmentation percentages lower than 50% and the $R_{DS(on)}$ penalty increases as well. A source segmentation coverage percentage range of 50-67% yields the best tradeoff between $R_{DS(on)}$ and FBSOA in this particular case. The optimum source coverage percentage range will be different for other specific designs or cases. However, other broader source segmentation percentage ranges such as 5-95% can also be used in embodiments with varying degrees of improvement in the FBSOA.

Figure 18:
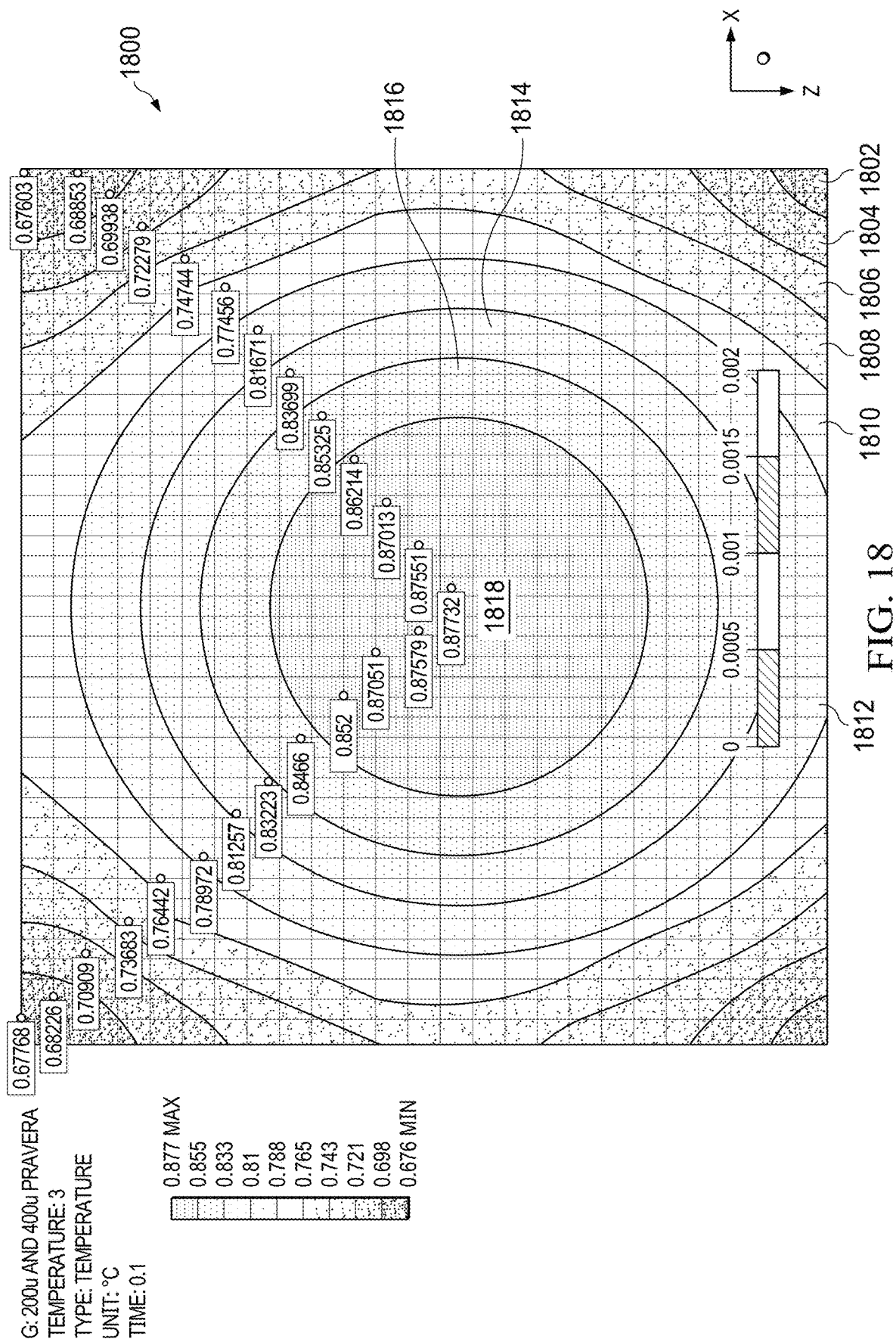
FIG. 18 is a plan view of a power device comprising radial variation of the source segmentation according to embodiments.

FIG. 18 is a plan view of a power device 1800 comprising radial variation of the source segmentation according to embodiments. The die center of power device 1800 has the highest thermal impedance $R_{th}$ and the edges of power device 1800 have the lowest thermal impedance $R_{th}$. This distribution of thermal impedance leads to thermal instability and FBSOA failure near the center of the die. Source segmentation coverage percentage can be varied radially to cancel the effect of inherent Rth variation. Relative temperatures vary from a maximum of about 0.87732 at the center of the die to a minimum of about 0.67768 in a first corner of the die and to a minimum of about 0.67603 in a second corner of the die.

FIG. 18 is thus a plan view of a power device 1800 comprising a plurality of concentric source segmentation zones 1818, 1816, 1814, 1812, 1810, 1808, 1806, 1804, and 1802 extending from a center of the device (segmentation zone 1818) to edges of the device (segmentation zones 1812, 1810, 1808, 1806, 1804, and 1802), wherein each concentric source segmentation zone comprises a plurality of gate stripes formed on an upper surface of the device, wherein a shared perimeter between the gate stripes defines a source stripe perimeter; and a segmented source formed between the gate stripes, wherein an edge length of the segmented source covers a percentage of the source stripe perimeter that varies according to a distance of the concentric source segmentation zone from the center of the device. For example, the percentage is at a minimum within a concentric source segmentation zone closest to the center of the device (segmentation zone 1818), and at a maximum within a concentric source segmentation zone closest to the edges of the device (segmentation zone 1802).

Source segmentation percentages (and therefore Gm) are kept lowest at the center of the die as the thermal impedance $R_{th}$ is highest at center. Thus source segmentation percentage should be ideally varied inversely to the thermal impedance $R_{th}$. The ideal concentric source segmentation zone pattern is to substantially match the thermal impedance $R_{th}$ pattern shown in FIG. 18. Circular and rectangular concentric source segmentation zone patterns approximate the oval or ellipse source segmentation zone pattern shown in FIG. 18. Other pattern variations can be used such as a rectangular pattern with rounded edges, for example. Many other such patterns can also be used.

Figure 19:
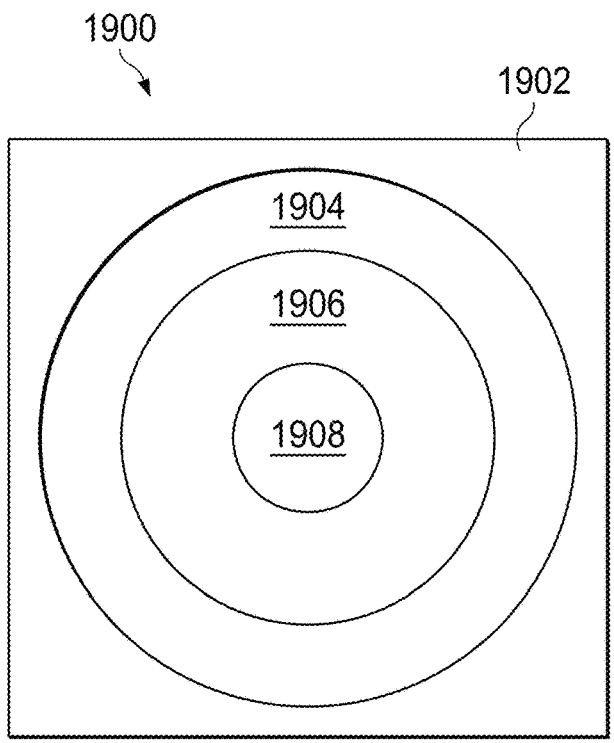
FIG. 19 is a plan view of a power device comprising circular radial variation of the source segmentation according to an embodiment.

FIG. 19 is a plan view of a power device 1900 comprising circular radial variation of the source segmentation according to an embodiment. Circular concentric source segmentation zones 1908, 1906, 1904, and 1902 are shown. Source segmentation percentage is varied from the center of the die (zone 1908) to the edge of the die (zone 1902). The minimum source segmentation percentage is in the center zone 1908, and increases to a maximum source segmentation percentage in the edge zone 1902.

Figure 20:
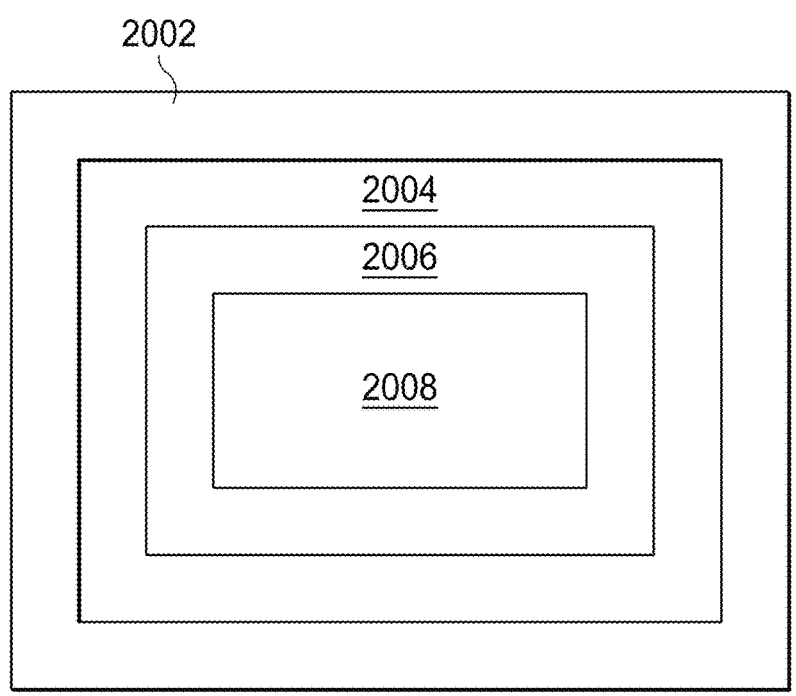
FIG. 20 is a plan view of a power device comprising rectangular radial variation of the source segmentation according to an embodiment.

FIG. 20 is a plan view of a power device comprising rectangular radial variation of the source segmentation according to an embodiment. Rectangular concentric source segmentation zones 2008, 2006, 2004, and 2002 are shown. Source segmentation percentage is varied from the center of the die (zone 2008) to the edge of the die (zone 2002). The minimum source segmentation percentage is in the center zone 2008, and increases to a maximum source segmentation percentage in the edge zone 2002.

In FIGS. 18, 19, and 20 the segmented sources can comprise partial single side sources, checkered sources, or laddered sources, or any combinations thereof. The type of segmented sources can be the same in a plurality of concentric source segmentation zones, or can be varied from one source segmentation zone to another, or even within a single source segmentation zone.

Figure 21A:
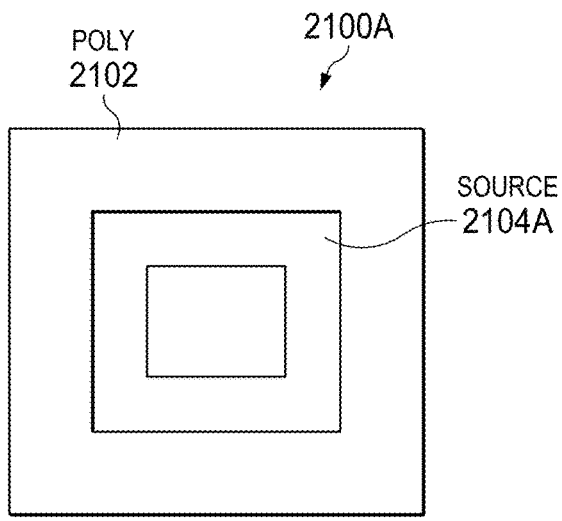
FIG. 21A is a plan view of cellular power device having a square source in a square cell according to the prior art.

FIG. 21A is a plan view of cellular power device 2100A having a square source 2104A in a square cell 2102 according to the prior art.

Figure 21B:
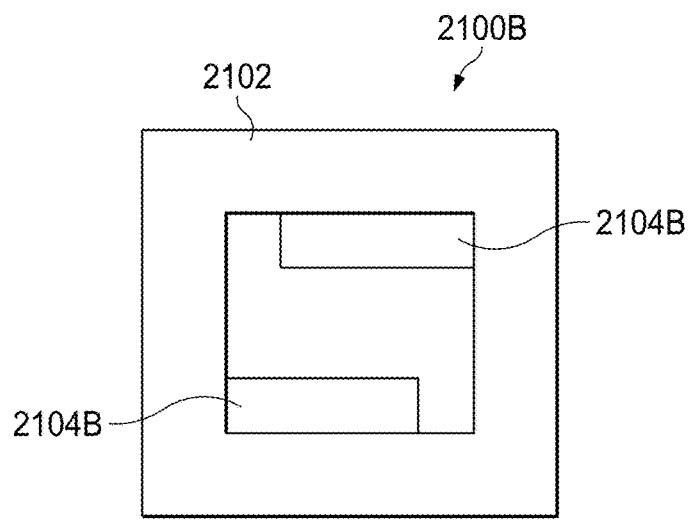
FIG. 21B is a plan view of a cellular power device having a segmented square source with two segments in a square cell according to an embodiment.

FIG. 21B is a plan view of a cellular power device 2100B having a segmented square source with two segments 2104B in a square cell 2102 according to an embodiment.

Figure 21C:
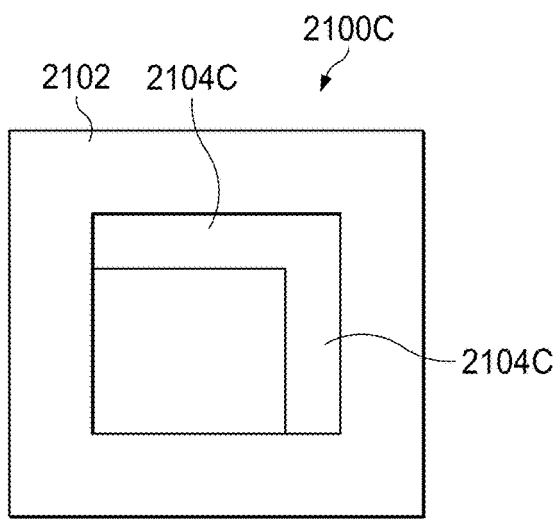
FIG. 21C is a plan view of a cellular power device having a segment square source with a single segment in a square cell according to an embodiment.

FIG. 21C is a plan view of a cellular power device 2100C having a segment square source with a single segment 2104C in a square cell 2102 according to an embodiment.

Thus, according to embodiments, a cellular power device having a segmented source comprises a plurality of cells, wherein each cell comprises a gate region on an upper surface of a device, wherein an inner perimeter of the gate region defines a source perimeter, and a segmented source having an outer perimeter adjacent to the source perimeter, wherein an outer perimeter of the segmented source is between 5% to 95% of the source perimeter. The segmented source comprises one or more segments. Two source segments 2104B are shown in FIG. 21B, and a single source segment 2104C is shown in FIG. 21C.

FIG. 22 illustrates plan views of various power device cell configurations suitable for comprising segmented sources according to embodiments. Shown in the table 2200 of FIG. 22 are seven different cellular designs commonly used for power devices. Table 2200 shows a linear cell 2202 and a square well in a square cell 2204, both previously described. Table 2200 also shows a circular well in a square cell 2206, a hexagonal well in a square cell 2208, a square well in a hexagonal cell 2210, a circular well in a hexagonal cell 2212, and a hexagonal well in a hexagonal cell 2214.

Rectangular cells are also used. The source segmentation previously illustrated and described, particularly with respect to FIGS. 21B and 21C, can be applied to any of these cellular layouts. For example a segmented source can be used where the cell comprises a square, rectangular, or hexagonal cell. A segmented source can be used where source perimeter comprises a square, circle, rectangle or hexagonal perimeter. Any of the other source segmentation features shown and previously described with respect to the linear cell can also be used, for example the use of evenly or irregularly spaced source segments or the use of source segments with rounded corners. Cellular power devices having segmented sources can also be used in the radial variation of the source segmentation according to embodiments.

It will be apparent to those skilled in the art that source segmentation as described herein can be extended to any other power device structure such as planar, trench, conventional, and charge balanced devices and also various device types including MOSFET, Insulated Gate Bipolar Transistors ("IGBT"), and Injection-Enhanced Gate Transistor ("IEGT") devices. The examples listed immediately above are not meant to be limiting. For example, source segmentation can be used in a trench device as is described below with respect to FIGS. 23A, 23B, 24A, and 24B.

Figure 23A:
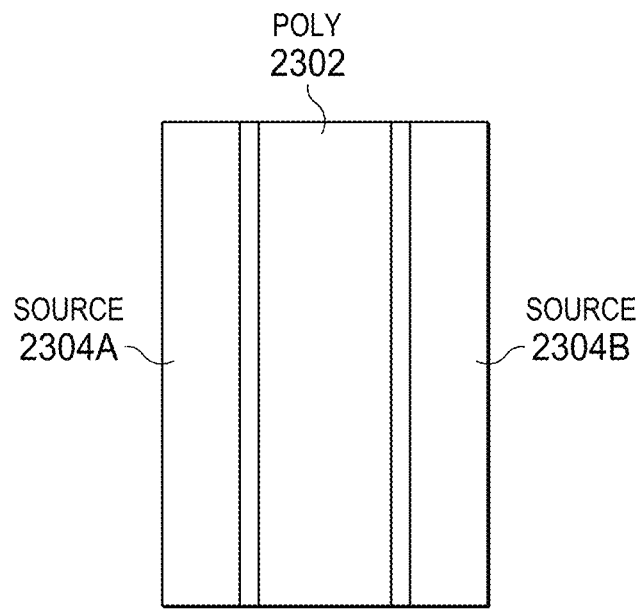
FIG. 23A is a plan view of a power device having a trenched gate according to the prior art.
Figure 23B:
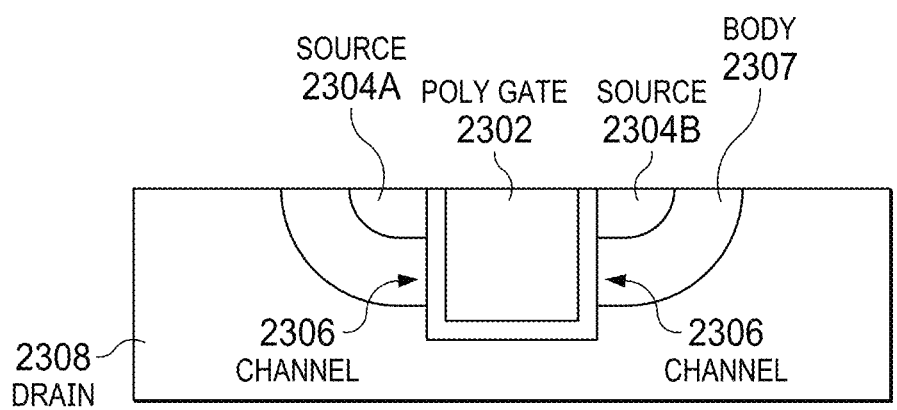
FIG. 23B is a cross-sectional view of the power device corresponding to the plan view of FIG. 23A.

FIG. 23A is a plan view of a power device having a trenched gate according to the prior art having a polysilicon trench gate 2302 and two adjacent sources 2304A and 2304B. FIG. 23B is a cross-sectional view of the power device corresponding to the plan view of FIG. 23A, including trenched gate 2302, doped sources 2304A and 2304B, channel 2306, body 2307, and drain 2308 extending to a bottom surface of the power device. Note that in FIGS. 23A and 23B the entire length of both edges of the polysilicon gate 2302 are in contact with the edge of sources 2304A and 2304B. In other words, 100% of the polysilicon gate perimeter is surrounded by a corresponding source edge.

Figure 24A:
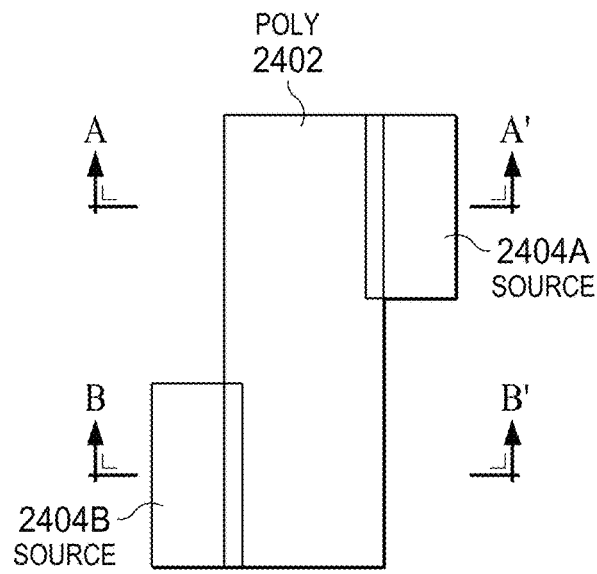
FIG. 24A is a plan view of a power device having a trenched gate and a segmented source according to an embodiment.
Figure 24B:
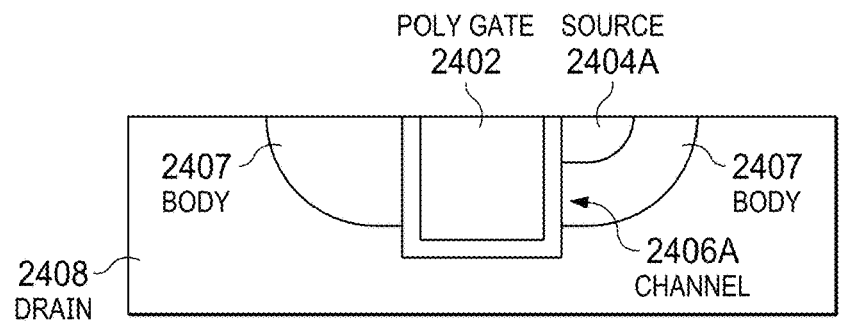
FIG. 24B is a first cross-sectional view of the power device corresponding to the plan view of FIG. 24A.
Figure 24C:
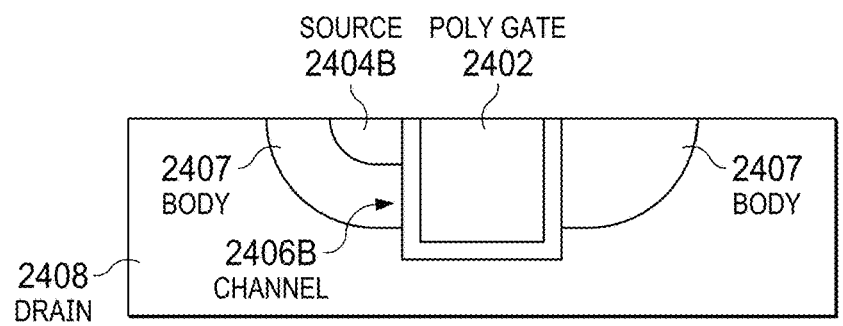
FIG. 24C is a second cross-sectional view of the power device corresponding to the plan view of FIG. 24A.

FIG. 24A is a plan view of a power device having a trenched gate 2402 and a checkered segmented source including sources 2404A and 2404B according to an embodiment. FIG. 24B is a first cross-sectional view of the power device corresponding to the plan view of FIG. 24A along line AA', including trenched gate 2402, doped source 2404A, channel 2406A, body 2407, and drain 2408 extending to a bottom surface of the power device. FIG. 24C is a second cross-sectional view of the power device corresponding to the plan view of FIG. 24A along line BB', including trenched gate 2402, doped source 2404G, channel 2406G, body 2407, and drain 2408 extending to a bottom surface of the power device.

Note that in FIGS. 24A, 24B, and 24C less than the entire length of both edges of the polysilicon gate 2402 are in contact with the edge of a source. In the case shown in FIGS. 24A, 24B, and 24C, less than 50% of the polysilicon gate perimeter is surrounded by a corresponding source edge. One of the polysilicon gate edges in contact with a corresponding source, and one is not. Additionally, there are polysilicon gate edges that are not in contact with any corresponding source or sources.

While only the checkered source segmentation technique is described and shown in the trench device example of FIGS. 24A, 24B, and 24C any of the other source segmentation techniques described herein can be used as well.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
    a plurality of cells, wherein each cell comprises:
    at least two gate stripes formed on an upper surface of the device; and
        a segmented source formed between the at least two gate stripes, wherein an edge length of the segmented source covers between 5% to 95% of an available source stripe perimeter, wherein the available source stripe perimeter is defined as a total edge length of facing edges of the at least two gate stripes, and wherein the edge length varies according to a distance of the segmented source from a center of the device.

2. The device of claim 1, wherein the segmented source comprises a partial single side source.

3. The device of claim 1, wherein the segmented source comprises a checkered source.

4. The device of claim 1, wherein the segmented source comprises an asymmetrical checkered source.

5. The device of claim 1, wherein the segmented source comprises a rounded checkered source.

6. The device of claim 1, wherein the segmented source comprises a laddered source.

7. The device of claim 1, wherein the segmented source comprises an asymmetrical laddered source.

8. The device of claim 1, wherein the segmented source comprises a rounded laddered source.

9. A device comprising:
    a plurality of concentric source segmentation zones extending from a center of the device to edges of the device, wherein each concentric source segmentation zone comprises:
    a plurality of gate stripes formed on an upper surface of the device; and
    a segmented source formed between two of the gate stripes, wherein an edge length of the segmented source covers a percentage of an available source stripe perimeter that varies according to a distance of the concentric source segmentation zone from the center of the device, wherein the available source stripe perimeter is defined as a total edge length of facing edges of the two of the plurality of gate stripes.

10. The device of claim 9, wherein the percentage is at a minimum within a concentric source segmentation zone closest to the center of the device, and at a maximum within a concentric source segmentation zone closest to the edges of the device.

11. The device of claim 9, wherein the plurality of concentric source segmentation zones comprises a plurality of oval or ellipse shaped concentric source segmentation zones.

12. The device of claim 9, wherein the plurality of concentric source segmentation zones comprises a plurality of circular concentric source segmentation zones.

13. The device of claim 9, wherein the plurality of concentric source segmentation zones comprises a plurality of rectangular concentric source segmentation zones.

14. The device of claim 9, wherein the segmented source comprises a partial single side source.

15. The device of claim 9, wherein the segmented source comprises a checkered source.

16. The device of claim 9, wherein the segmented source comprises a laddered source.

17. A device comprising:
 a plurality of cells, wherein each cell comprises:
 a gate region on an upper surface of a device, wherein a total length of an inner perimeter of the gate region defines an available source perimeter; and
 a segmented source having an outer perimeter adjacent to the available source perimeter, wherein an outer perimeter of the segmented source is between 5% to 95% of the available source perimeter, and wherein the outer perimeter varies according to a distance of the segmented source from a center of the device.

18. The device of claim 17, wherein the segmented source comprises one or more segments.

19. The device of claim 17, wherein the cell comprises a square, rectangular, hexagonal, or polygonal cell.

20. The device of claim 17, wherein the available source perimeter comprises a square, circle, rectangle, hexagonal, or any polygonal perimeter.

\* \* \* \* \*